United States Patent [19]
Gu et al.

[11] Patent Number: 5,650,358
[45] Date of Patent: Jul. 22, 1997

[54] METHOD OF MAKING A TFT HAVING A REDUCED CHANNEL LENGTH

[75] Inventors: Tieer Gu; Willem den Boer, both of Troy, Mich.

[73] Assignee: OIS Optical Imaging Systems, Inc., Northville, Mich.

[21] Appl. No.: 519,920

[22] Filed: Aug. 28, 1995

[51] Int. Cl.$^6$ ................................................. H01L 21/465
[52] U.S. Cl. .......................... 437/228; 437/40; 437/48; 437/235; 437/245; 437/913; 437/966
[58] Field of Search .................. 437/40, 48, 228, 437/245, 913, 966

[56] References Cited

U.S. PATENT DOCUMENTS

| | | |
|---|---|---|
| 4,618,873 | 10/1986 | Sasano et al. . |
| 4,723,838 | 2/1988 | Aoki et al. . |
| 4,862,234 | 8/1989 | Koden . |
| 4,949,141 | 8/1990 | Busta . |
| 5,045,485 | 9/1991 | Tanaka et al. ........................ 437/40 |
| 5,047,819 | 9/1991 | Tanaka et al. . |
| 5,051,800 | 9/1991 | Shoji et al. . |
| 5,055,899 | 10/1991 | Wakai et al. . |
| 5,071,779 | 12/1991 | Tanaka et al. . |
| 5,075,674 | 12/1991 | Katayama et al. . |
| 5,137,841 | 8/1992 | Takeda et al. . |
| 5,153,754 | 10/1992 | Whetten . |
| 5,156,986 | 10/1992 | Wei et al. . |
| 5,162,931 | 11/1992 | Holmberg . |
| 5,270,567 | 12/1993 | Mori et al. ........................ 257/412 |
| 5,294,811 | 3/1994 | Aoyama et al. . |
| 5,355,002 | 10/1994 | Wu . |
| 5,367,392 | 11/1994 | Janai . |
| 5,414,283 | 5/1995 | den Boer et al. . |

FOREIGN PATENT DOCUMENTS

| | | |
|---|---|---|
| 63-77159 | 4/1988 | Japan . |
| 283941 | 3/1990 | Japan . |

*Primary Examiner*—Edward Wojciechowicz
*Attorney, Agent, or Firm*—Myers Liniak & Berenato

[57] ABSTRACT

A thin film transistor (TFT) for a liquid crystal display (LCD) and method of making same is disclosed, the TFT having a source and drain electrode where at least one of the source and drain includes first and second conductive layers offset from one another by a distance $\Delta L$ so that the resulting TFT channel length $L_T$ is equal to $L_T = L_{1,2} - \Delta L$ where $L_{1,2}$ is either a channel length defined in the first conductive layer or a channel length defined in the second conductive layer. The TFT manufacturing process includes the steps of: a) providing a conductive gate layer and patterning same to form a gate electrode; b) depositing a substantially transparent conductive layer (e.g. ITO) and patterning same to form a pixel electrode; c) depositing and patterning a semiconductor layer (e.g. a-Si); a doped semiconductor contact layer; and a first source-drain conductive layer so as to form a TFT island or area; d) using a single photoresist to etch a channel in the first source-drain layer and a via in a gate insulating layer so as to expose the pixel electrode; and e) depositing and patterning a second source-drain layer over the via and the etched first source-drain layer so as to form a TFT with reduced channel length $L_T$ wherein the second source-drain layer contacts the pixel electrode through the via.

12 Claims, 8 Drawing Sheets

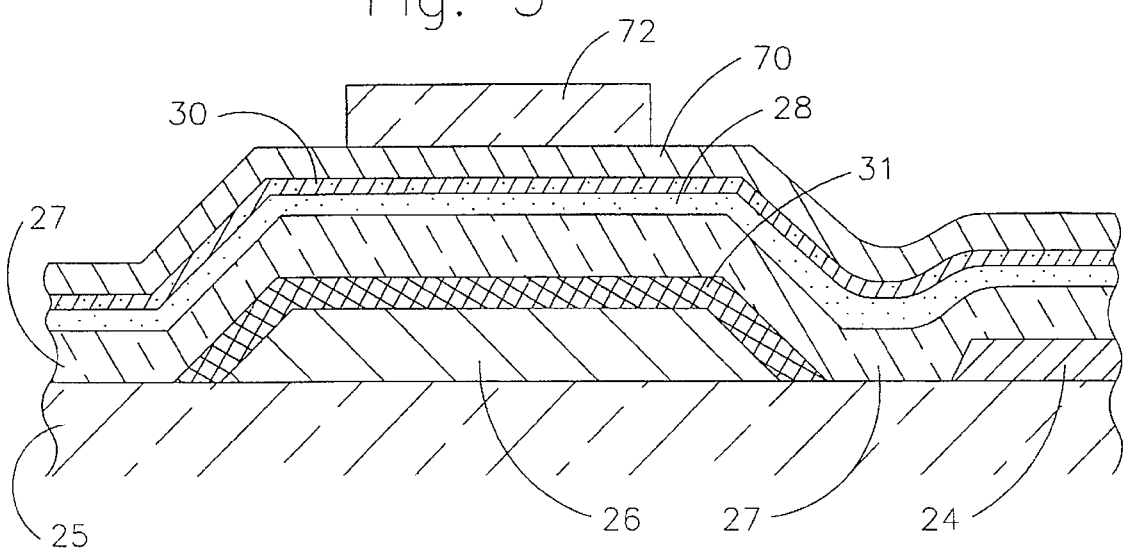
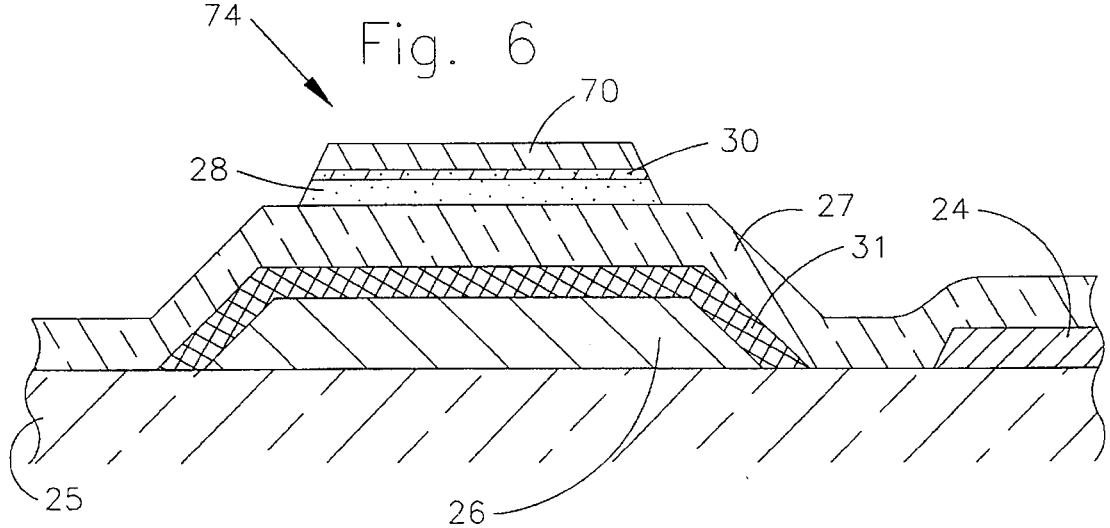

METHOD OF MAKING A TFT HAVING A REDUCED CHANNEL LENGTH

RELATED APPLICATION

This application is related to commonly owned U.S. application Ser. No. 08/444,673 which was filed May 19, 1995 the disclosure of which is hereby incorporated herein by reference. The application Ser. No. 08/444,673 application discloses a TFT for a liquid crystal display (LCD) and method of making same wherein the TFT has a reduced channel length.

This invention relates to a thin film transistor and corresponding method of making same. More particularly, this invention relates to a thin film transistor (TFT) adapted to be used in an array in a liquid crystal display (LCD) or the like, each TFT having a reduced channel length so as to limit gate-source (or parasitic) capacitance which in turn reduces pixel flickering and image retention thereby improving the viewing characteristics of the display.

BACKGROUND OF THE INVENTION

Liquid crystal displays (LCDs) typically include an array of isolation or switching devices such as TFTs or diodes. Thin film transistors (TFTs) formed from deposited semiconductors such as amorphous silicon (a-Si) alloys are ideally suited for such applications because they exhibit a high dark resistivity and, therefore, have low OFF state currents. The leakage currents are low so that high on-to-off current ratios are made possible for effectively isolating non-addressed array pixels from the pixels being addressed. Current flow through TFTs between the source and drain is controlled by the application of voltage to the gate electrode. Voltage to the gate electrode produces an electric field which accumulates a charged region near the semiconductor-gate insulator interface. This charged region forms a current conducting channel in the semiconductor through which current is conducted.

The source and drain electrodes in conventional TFT arrays are typically deposited and patterned on a substrate by way of either flat panel steppers or large area scanning projection aligners in order to define a channel length and width between the source and drain. Large area scanning projection aligners which use a single large area mask typically cost about half as much as flat panel steppers, and have about twice the manufacturing throughput as the steppers. Conventional scanning projection aligners typically have a resolution of from about 4 to 6 µm while conventional flat panel steppers typically have a resolution of from about 3 to 4 µm. In consideration of cost and manufacturing throughput, it is clear that it would be desirable to utilize scanning projection aligners as opposed to flat panel steppers so as to decrease manufacturing costs and increase production throughput.

TFT channel lengths smaller than those achievable with certain scanning projection aligners are often desirable for reasons to be discussed below. Typically, TFT source-drain channel lengths of about 6 µm can be obtained with some scanning projection aligners. However, it is often desirable to reduce channel lengths to less than 6 µm. For yield purposes, however, channel length design often exceeds resolution of the aligners by a factor of about 1.5 to 2.

The resulting channel length of a TFT is typically larger or longer than the feature size of the aligner used due to overetching of the source and drain. In the case of Mo source-drain metal, for example, the overetch is typically about 1 µm so that a designed channel length of 4 µm ends up as a post-processing TFT channel length of about 6 µm. As a result of this, the channel width must be increased in order to maintain the same ON current because the TFT ON current is proportional to W/L where "W" is the channel width and "L" is the channel length. Accordingly, there exists a need in the art for a thin film transistor (and method of manufacturing same) having a channel length smaller than that allowed by the feature size or resolution of the equipment used to manufacture the TFT (given a particular yield requirement) so that, for example, about a 4 µm channel length or less can be achieved using low-cost equipment such as scanning projection aligners (instead of flat panel steppers). It is desirable to perform as few manufacturing steps as possible in making a TFT and corresponding LCD.

Smaller TFT channel lengths are desirable for the following reasons. Pixel voltage shift $\Delta V_p$ in thin film transistor LCDs after switching off the gate electrode is proportional to the gate-source capacitance ($C_{gs}$) of the thin film transistor. $\Delta V_p$ can cause flicker, image retention, and gray level non-uniformity in liquid crystal display operation. An effective way to reduce $C_{gs}$ (i.e. parasitic or gate-source capacitance) is by shortening the channel length of the TFT. When a channel length is reduced, the channel width "W" can be reduced proportionally so as to decrease $C_{gs}$ because $C_{gs}$ is proportional to the channel width. Such reduction in channel width is permitted while the same $I_{ON}$ of the TFT is maintained due to the reduced channel length. This reduction in channel width is a major contributor in reducing $C_{gs}$.

FIG. 1 is a side elevational cross sectional view of prior art linear thin film transistor (TFT) 1. See U.S. Pat. No. 5,055,899. A plurality of TFTs 1 are typically arranged on transparent insulating substrate 3 in the form of a matrix array in AMLCD applications. Each TFT 1 includes gate electrode 5 connected to a gate line (not shown) extending in the row direction, drain electrode 7 connected to a drain line (not shown) extending the column direction, and source electrode 9 connected to transparent pixel electrode 11 independently formed in an area surrounded by the gate and drain lines. Pixel electrode 11 operates in conjunction with an opposing electrode on the other side of the liquid crystal (LC) layer (not shown) so as to selectively drive the pixel enabling the respective polarizers to transmit or absorb light rays in order to create an image for the viewer. A TFT electrode, to which a data signal is supplied, will be referred to hereinafter as a drain electrode.

More specifically, gate electrode 5 is formed on clear substrate 3. Gate insulating film 13, made of silicon oxide or silicon nitride, for example, is formed both on substrate 3 and on the upper surface of gate electrode 5. Semiconductor film 15, consisting of amorphous silicon (a-Si), for example, is stacked on gate insulating film 13 above gate 5. Drain and source electrodes 7 and 9 respectively are formed on semiconductor film 15. The linear shaped source and drain electrodes are separated from one another by a predetermined distance forming channel length 17. Drain and source electrodes 7 and 9 respectively utilize contact layers 7a and 9a, and source-drain metal layers 7b and 9b, and are electrically connected to semiconductor film 15.

Unfortunately, when prior art TFT 1 is manufactured using, for example, a conventional scanning projection aligner to position the source and drain electrodes on substrate 3, the resulting channel length 17 of TFT 1 cannot be made as small as often desired thereby resulting in an undesirably high parasitic capacitance ($C_{gs}$). High parasitic capacitance values for TFTs are undesirable as set forth above because they tend to cause pixel flickering, image retention, and gray scale non-uniformity. As the parasitic capacitance of a TFT is decreased, the pixel voltage shift when the gate is switched off becomes smaller. As the pixel voltage shift decreases, it becomes easier to compensate the top plate voltage to eliminate DC components for all gray levels across the entire display area.

Flickering results from a small DC component across the pixel electrodes spanning the liquid crystal layer. Pure AC voltage across the electrodes is ideal. By reducing the parasitic capacitance, the DC component across the pixel electrodes can be substantially eliminated or reduced thereby greatly reducing pixel flickering, electrochemical degradation, and image retention of the LC material.

In view of the above, it is apparent that there exists a need in the art for a liquid crystal display including a TFT array and method of making same using the least number of manufacturing steps as possible, wherein the TFTs in the array have reduced parasitic capacitances and are cost effective to manufacture. Such TFTs are achievable in accordance with this invention by reducing the obtainable TFT channel lengths so as to decrease parasitic capacitance values in order to reduce flickering, image retention, and gray scale non-uniformity of the display. It would also be desirable if TFT channel lengths smaller than those allowed by the feature size of the manufacturing equipment and compatible with high yield requirements could be obtained so as to reduce costs.

It is a purpose of this invention to fulfill the above-described needs, as well as other needs in the art which will become more apparent to the skilled artisan once given the following disclosure.

Above-identified U.S. application Ser. No. 08/444,673 discloses one way in which to solve certain of the above-discussed problems in the prior art. While the '673 invention is an excellent solution to these problems in of itself, the invention(s) according to certain embodiments of this application offer alternative efficient solutions.

SUMMARY OF THE INVENTION

Generally speaking, this invention fulfills the above-described needs in the art by providing a method of making a thin film transistor comprising the steps of:

depositing a gate layer on a substrate;

applying a first photoresist layer over the gate layer and thereafter etching the gate layer using the first photoresist so as to form a gate electrode;

depositing a substantially transparent conductive layer on the substrate;

applying a second photoresist layer over the substantially transparent layer and thereafter etching the substantially transparent layer using the second photoresist so as to form a pixel electrode;

depositing a gate insulating layer, a semiconductor layer, a doped semiconductor contact layer, and a first source-drain conductive layer on the substrate;

applying a third photoresist layer over the gate insulating layer, semiconductor layer, doped semiconductor contact layer, and first source-drain layer;

etching the first source-drain layer, the doped semiconductor contact layer, and the semiconductor layer using the third photoresist layer so as to form a thin film transistor area or island;

applying a fourth photoresist layer over the gate insulating layer and the transistor island;

etching a via into the gate insulating layer using the fourth photoresist layer so that the pixel electrode is exposed through the via;

etching a channel of length $L_1$ in the first source-drain on the island using the fourth photoresist;

depositing a second source-drain conductive layer on the substrate over the etched channel in the first source-drain layer and the via so that the second source-drain layer conductively contacts the pixel electrode through the via; and applying a fifth photoresist layer over the second source-drain layer and etching a channel of length $L_2$ into the second source-drain layer using the fifth photoresist layer so as to form a thin film transistor.

This invention further fulfills the above-described needs in the art by providing a thin film transistor comprising:

a gate electrode;

a source electrode;

a drain electrode; and wherein one of the source and drain electrodes includes first and second conductive metal layers offset with respect to one another so that the thin film transistor has a reduced channel length.

In certain preferred embodiments of this invention, the thin film transistor channel length $L_T$ is defined by the equation $L_T = L_{1,2} - \Delta L$ where $L_{1,2}$ is the length defined between the first conductive layer and the similar layer of the other of the source and drain electrodes, and $\Delta L$ is the lateral offset between the first and second conductive layers.

In still further preferred embodiments of this invention, the first and second conductive layers are of different metals adapted to be etched (either dry or wet etched) by different etchants.

This invention still further fulfills the above-described needs in the art by providing a method of making a liquid crystal display including a plurality of thin film transistors, the method comprising the steps of:

providing a plurality of gate electrodes on a first substrate;

depositing a substantially transparent layer on the first substrate;

patterning the substantially transparent layer so as to form a plurality of pixel electrodes for applying a voltage to a liquid crystal layer;

providing a gate insulating layer on the first substrate over the gate electrodes;

depositing and patterning a semiconductor layer on the first substrate over the gate insulating layer so as to form a plurality of transistor islands or areas;

depositing a first conductive layer over the semiconductor layer and patterning the first conductive layer so that the patterned first conductive and semiconductor layers form the transistor islands;

applying a photoresist layer over the islands and the gate insulating layer;

etching (i) vias in the gate insulating layer using the photoresist so as to expose the pixel electrodes and (ii) channels in the first conductive layers on the islands using the photoresist;

providing a second conductive layer on the first substrate over the etched first conductive layer so that the second conductive layer contacts the pixel electrodes through the vias and also contacts the first conductive layer on the islands;

patterning the second conductive layer so as to form transistor channels having a length $L_T$; and providing the liquid crystal layer between the first substrate and a second substrate thereby forming a liquid crystal display.

This invention will now be described with respect to certain embodiments thereof, along with reference to the accompanying illustrations wherein:

IN THE DRAWINGS

FIG. 5 is a side elevational cross sectional view of a further step in the manufacture of the TFT of FIGS. 2–4, wherein a gate insulating layer, a semiconductor layer, a doped semiconductor layer, a first source-drain layer, and a third photoresist are provided on the substrate.

FIG. 6 is a side elevational cross sectional view of a further step in the manufacture of the TFT of FIGS. 2–5, after the TFT island or area is formed using the third photoresist.

DETAILED DESCRIPTION OF CERTAIN EMBODIMENTS OF THIS INVENTION

Figure 1:
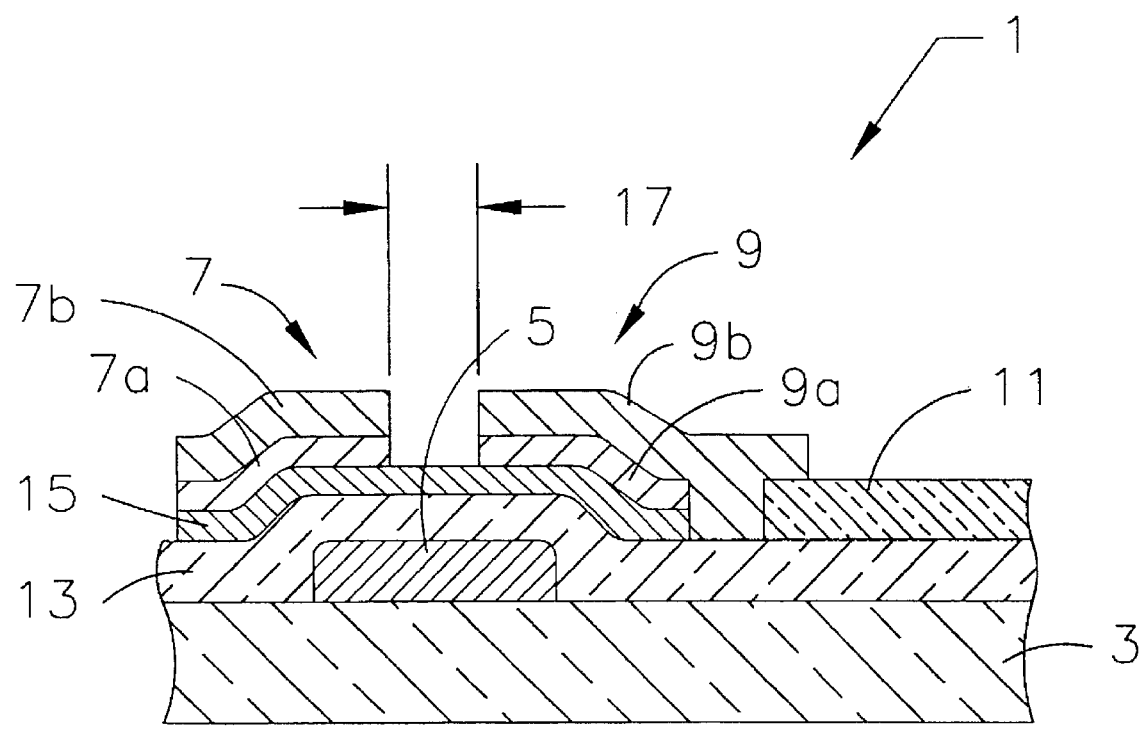
FIG. 1 is a side elevational cross sectional view of a prior art linear-type TFT where the source and drain electrodes are deposited and patterned in the same manufacturing steps so that the resulting TFT channel length is limited by required yield and the feature size of the lithography used.
Figure 2:
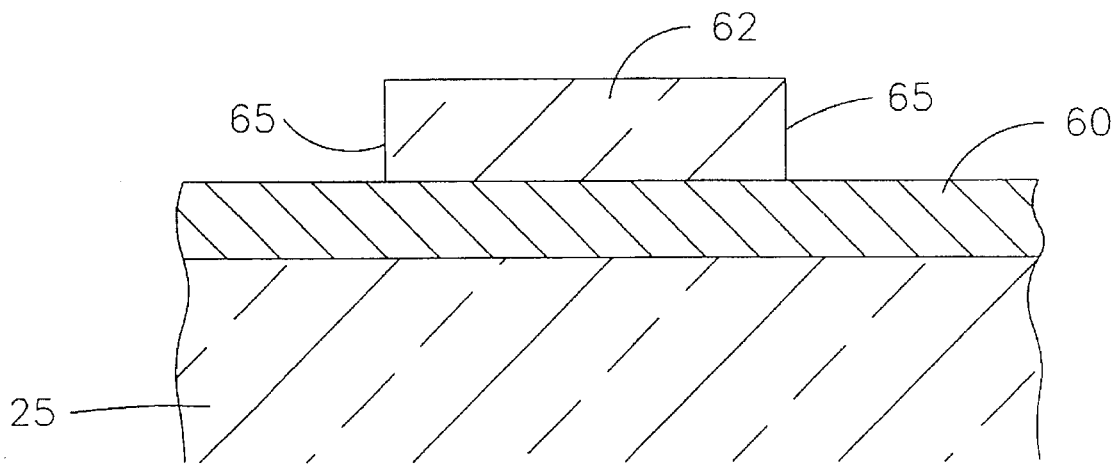
FIG. 2 is a side elevational cross sectional view of a beginning step in the manufacture of a TFT according to an embodiment of this invention, wherein a conductive gate layer and first photoresist layer are provided on a substrate.

Referring now more particularly to the following illustrations where like reference numerals indicate like parts throughout the several views.

Figure 10A:
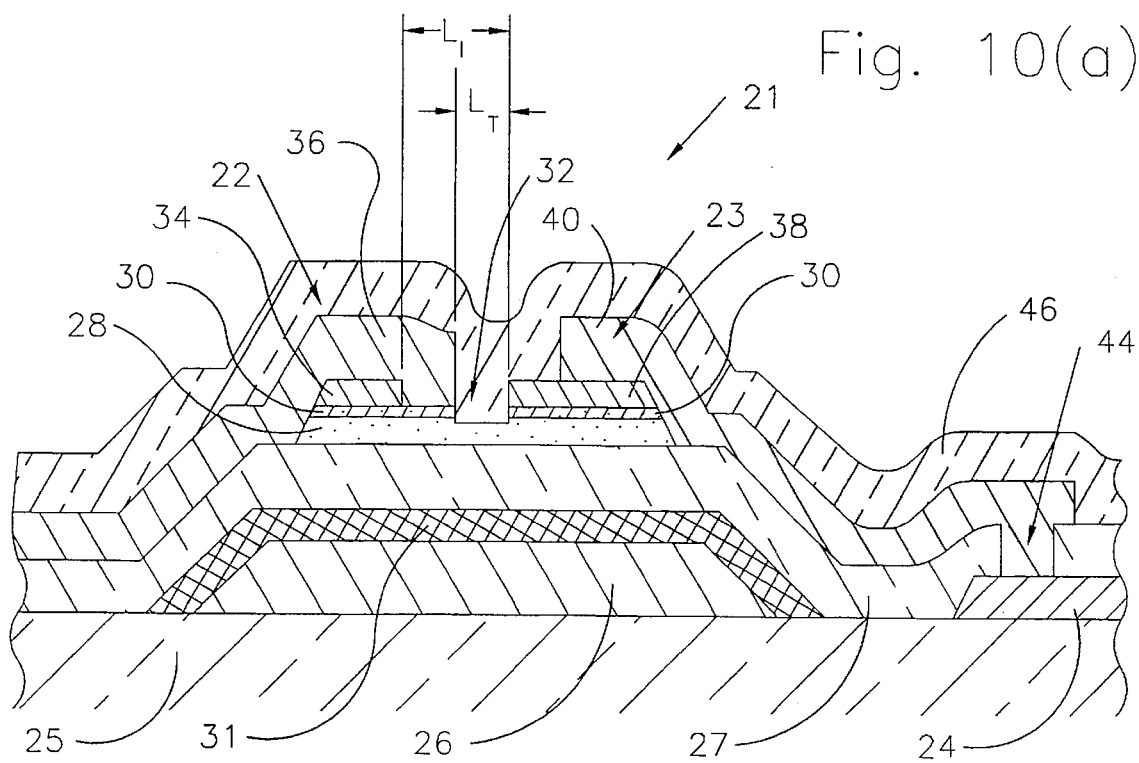
FIG. 10(a) is a side elevational cross sectional view of the amorphous silicon (a-Si) thin film transistor (TFT) resulting from the manufacturing steps set forth in FIGS. 2–9.
Figure 10B:
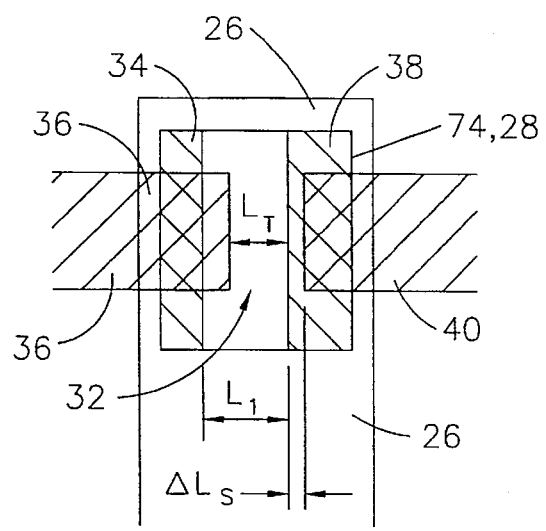
FIG. 10(b) is a top view of the TFT of FIG. 10(a).

FIG. 10(a) is a side elevational cross sectional view of a linear thin film transistor (TFT) 21 according to an embodiment of this invention. FIG. 10(b) is a top view of TFT 21. TFT 21 has a channel length $L_T$ shorter than that allowed or permitted by the feature size of the lithography (e.g. when a scanning projection aligner is utilized) used for patterning the conductive layers of drain electrode 22 and source electrode 23. Source electrode 23 of TFT 21 is connected to LCD pixel electrode 24 so as to permit TFT 21 to selectively energize a corresponding LCD pixel in order to provide image data to a viewer, TFT 21 effectively functioning as a switch for the corresponding LCD pixel.

TFT 21, as shown in FIG. 10(a), is mounted on and includes substantially transparent substrate 25. Included in TFT 21 are a conductive gate electrode made up of metal layer 26 and optional anodized layer 31, gate insulating layer 27, semiconductor layer 28 (e.g. amorphous silicon), doped semiconductor contact layer 30, drain electrode 22, source electrode 23, and passivation layer 46 (e.g. $Si_3N_4$).

Drain electrode 22 includes both metal drain layer 34 (e.g. Cr) and metal drain layer 36 (e.g. Mo), with contact film 30 (e.g. amorphous silicon doped with an impurity such as phosphorus) disposed between a-Si semiconductor layer 28 and upper conductive drain layer 34. Conductive drain layers 34 and 36 in the drain are offset with respect to one another laterally by an amount $\Delta L_D$ (see FIG. 9) so that upper layer 36 is disposed closest to and defines linear TFT channel 32 while lower layer 34 is located in a spaced relation relative to channel 32. As will be discussed below, conductive drain layers 34 and 36 are deposited in separate steps and are of different metals so that the etchant for layer 36 will not etch layer 34.

Source electrode 23 of TFT 21 includes metal layer 38 (e.g. Cr) and metal layer 40 (e.g. Mo). According to certain embodiments of this invention, source layer 38 is of the same material and is deposited at the same time as drain layer 34 such that layers 34 and 38 are originally deposited as a single source-drain layer 70 (see FIG. 5). Likewise, source layer 40 and drain layer 36 according to certain embodiments of this invention are of the same material and are deposited at the same time originally so that layers 40 and 36 also originate from a single source-drain layer as will be further discussed below.

Figure 9:
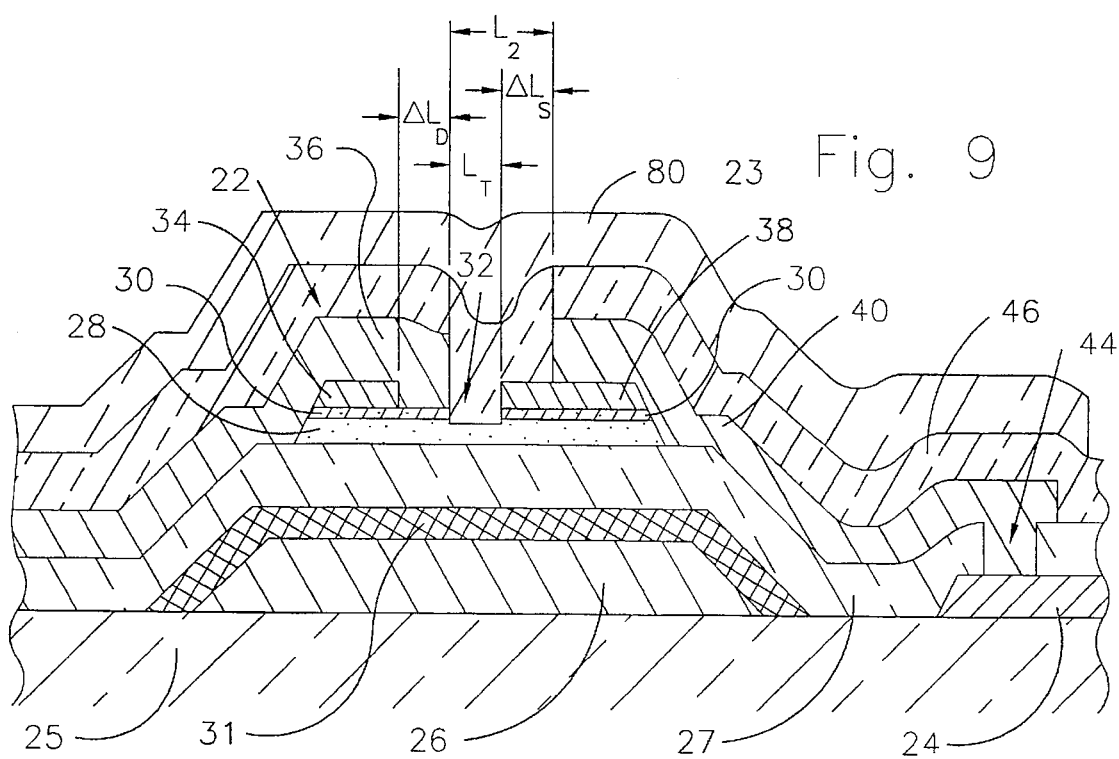
FIG. 9 is a side elevational cross sectional view of still a further step in the manufacture of the TFT of FIGS. 2–8, wherein a passivation layer and sixth photoresist are provided over the TFT on the substrate.

Still referring to FIGS. 10(a)–10(b), source layers 38 and 40 are deposited and patterned on substrate 25 in separate steps over top of gate 26, gate insulating layer 27, a-Si semiconductor layer 28, and doped silicon contact layer 30. Source layers 38 and 40 are offset with respect to one another laterally by a distance $\Delta L_S$ as shown in FIG. 9 so that lower layer 38 is closest to and defines TFT channel 32 of length $L_T$ while layer 40 is located over top of layer 38 in a spaced relation with respect to channel 32. The offsetting of the conductive layers of both source electrode 23 and drain electrode 22 permits transistor channel 32 to be of a reduced length $L_T$ thereby reducing the parasitic capacitance of the transistor thus reducing pixel flickering, reducing electrochemical degradation, and improving image retention characteristics of the LC material as known in the art. Exemplary channel lengths $L_T$ of TFT channel 32 are from about 2 to 10 μm, preferably from about 5 to 7 μm, and most preferably about 6 μm given high yield requirements according to certain embodiments of this invention. The achieved channel length is also a function of yield requirements (i.e. the less shorts required, the longer the channel lengths used).

Alternatively, upper conductive layer 40 of source 23 may define channel 32 in combination with lower conductive layer 34 of drain 22, so that the offsets are in opposite directions in the source and drain. However, the embodiment illustrated in the Figures is thought to result in better parasitic capacitance values.

Layer 40 of TFT source 23 is deposited on substrate 25 so as to both define a portion of source 23 and simultaneously contact pixel electrode 24 through via 44. Via 44 is defined as an aperture in gate insulating layer 27 as will be discussed below.

With reference to FIGS. 2–10, it will now be explained how a-Si TFT 21 is manufactured. Beginning with FIG. 2, gate metal layer 60 (which results in the gate electrode) is deposited on the top surface of substrate 25 to a thickness of from about 1,000–5,000 Å, most preferably to a thickness of about 2,500 Å. Gate layer 60 is deposited by way of sputtering or vapor deposition according to certain embodiments of this invention. The gate metal may be tantalum (Ta) or aluminum (Al) according to certain embodiments. Insulating substrate 25 may be made of glass, quartz, sapphire, plastic, or the like.

The structure including substrate 25 and deposited gate layer 60 is then photomasked by placing a first photoresist 62 over the gate layer, the mask pattern corresponding to the desired gate electrode(s) configuration and optionally the row address line(s) 53. Accordingly, the upper surface of gate layer 60 is exposed in windows or areas where photoresist 62 has not been retained. Next, gate layer 60 is dry etched when Ta (preferably using reactive ion etching) in order to retain the gate layer in accordance with the photoresist 62 pattern. It is noted that when the gate is aluminum (Al), wet etching is preferably used. To dry etch, the structure is mounted in a reactive ion etching (RIE) apparatus which is then purged and evacuated in accordance with known RIE procedures and etchants. This etching of gate layer 60 is preferably carried out until the gate layer metal is removed in center areas of the windows and is then permitted to proceed for an additional time (e.g. 20 to 40 seconds) of overetching to ensure that the gate metal is entirely removed from within the windows. The result is gate electrode 26 on top of substrate 25 as illustrated in FIG. 3.

The sloped edges 64 of the gate electrode result from photoresist 62 being etched back from its originally defined edge 65 as the gate metal RIE takes place. Sloped portions 64 are provided in RIE in part because when photoresist 62 is baked after patterning to toughen it prior to RIE, photoresist 62 slumps with the result being that its thickness tapers from small or zero at the edge of the photoresist region upward to a central thickness of the photoresist over a finite distance. During RIE, photoresist 62 erodes as the gate metal is etched with the result being tapers 64 produced on the retained portion of the gate metal. The tapered gate electrode shown in FIG. 3 may be provided in a variety of other ways well-known in the art including reliance on the erosion of photoresist 62 during etching of the gate conductor where RIE is employed, or alternatively an isotropic wet etch may be employed which undercuts the resist during etching of the unprotected portion of the gate metal.

After the formation of the gate electrode (e.g. Al or Ta) on substrate 25, the gate is anodized so as to form anodization layer 31 which is $Al_2O_3$ when the gate is Al, and TaO when the gate is Ta. It is noted that after anodization (which is optional), gate layer 26 which was deposited as the gate electrode (when Ta and originally about 2,500 Å thick) is about 1,800 Å thick and a newly created TaO layer 31 is about 1,600 Å thick. When an Al gate is provided about 1,000–4,000 Å thick, then the anodized $Al_2O_3$ layer 31 is about 500–2,000 Å thick. It is noted that layer 27 and the anodized layer 31 are optionally etched around the edges of the display so that the gate metal can be connected to the exterior electronics. Optionally, the leads may be protected by photoresist during anodization so that they are not anodized. Other metals from which the gate electrode (26 and 31) may be made include Cr, titanium, copper, tungsten, and combinations thereof.

Figure 3:
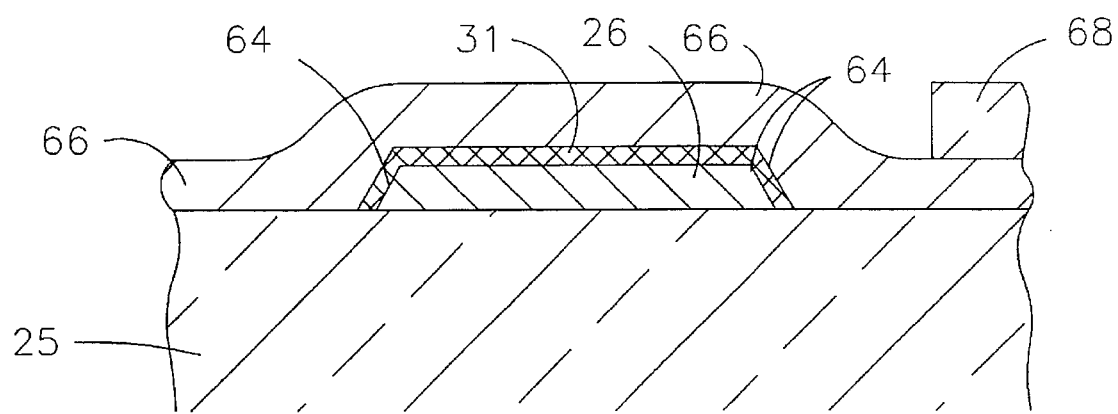
FIG. 3 is a side elevational cross sectional view of a further step in the manufacture of the TFT of FIG. 2, wherein a pixel electrode layer and second photoresist layer are added to the substrate.
Figure 4:
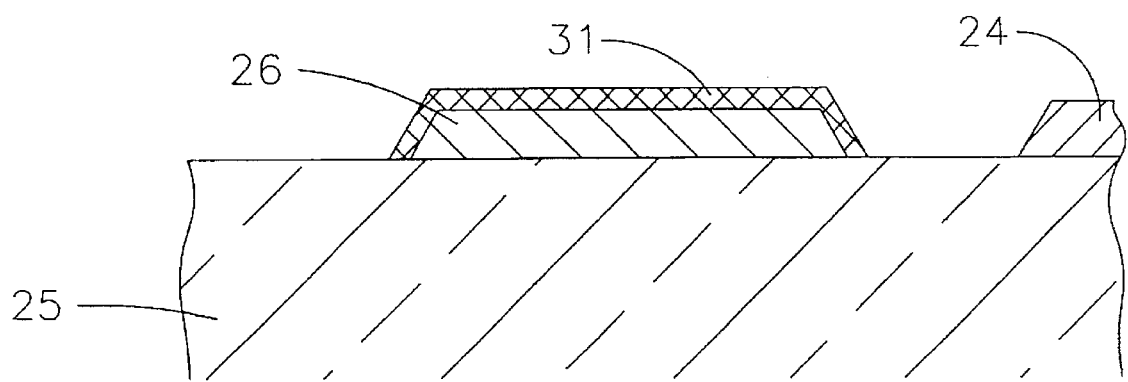
FIG. 4 is a side elevational cross sectional view of a further step in the manufacturing of the TFT of FIGS. 2–3, after the pixel electrode is formed (e.g. etched) from the pixel electrode layer using the second photoresist.

After the gate electrode is deposited and patterned on top of substantially transparent substrate 25 in the above-described manner, a substantially transparent conductive layer 66 is deposited on substrate 25 over top of the gate as shown in FIG. 3. Layer 66 may be indium-tin-oxide (ITO), or the like. Following the provision of layer 66 on substrate 25, second photoresist 68 is provided or applied on top of conductive ITO layer 66 so that the pattern of photoresist 68 is substantially the same as the desired pixel electrode pattern. Thereafter, layer 66 is etched or otherwise removed in a conventional manner from the areas from which photoresist 68 is not retained. The result is ITO pixel electrode 24 in combination with the gate electrode (26, 31) being left on substrate 25 as illustrated in FIG. 4. Alternatively, pixel electrode 24 may be deposited and patterned on substrate 25 prior to the deposition and patterning of the gate electrode.

After pixel electrode 24 and gate electrode 26, 31 have been deposited, patterned, and formed on substrate 25 (see FIG. 4) in the above-described manner, gate insulating or dielectric layer 27 is deposited over the entire substrate 25 preferably by plasma enhanced chemical vapor deposition (PECVD) or some other process known to produce a high integrity dielectric. Gate insulating layer 27 is preferably silicon nitride ($Si_3N_4$) but may also be silicon dioxide or other known dielectrics. Gate insulating layer 27 is deposited to a thickness of from about 2,000–3,000 Å (preferably either about 2,000 Å or 3,000 Å).

With reference to FIG. 5, after layer 27 has been deposited, semiconductor (e.g. intrinsic a-Si) layer 28 is deposited via PECVD on gate insulating layer 27 to a thickness of about 2,000 Å. Semiconductor layer 28 may be from about 1,000 to 4,000 Å according to certain embodiments of this invention. Then, doped (typically phosphorus doped, that is n+) amorphous silicon contact layer 30 is deposited over intrinsic a-Si layer 28 in a known PECVD manner to a thickness of, for example, about 500 Å. Doped contact layer 30 may be from about 200–1,000 Å thick according to certain embodiments of this invention.

Gate insulating layer 27, semiconductor layer 28, and doped semiconductor contact layer 30 may all be deposited on substrate 25 in the same deposition chamber without breaking the vacuum according to certain embodiments. When this is done, the plasma discharge in the deposition chamber is stopped after the completion of the deposition of a particular layer (e.g. insulating layer 27) until the proper gas composition for deposition of the next layer (e.g. layer 28) is established. Subsequently, the plasma discharge is reestablished to deposit the next layer (e.g. layer 28). Alternatively, layers 27, 28, and 30 may be deposited in any known manner in the same or different chambers.

Thereafter, still referring to FIG. 5, source-drain metal layer 70 (which results in layers 34 and 38) is deposited by sputtering on substrate 25 over top of semiconductor layer 28 and contact layer 30. This source-drain metal 70 may be chromium (Cr) according to certain embodiments of this invention. Cr layer 70 is deposited to a thickness of from about 500–2,000 Å, preferably about 1,000 Å according to certain embodiments. Other metals which may be used for layer 70 (and thus layers 34 and 38) include titanium, aluminum, tungsten, tantalum, copper, or the like.

Next, third photoresist 72 is applied over top of layers 27, 28, 30, and 70 on substrate 25 so that the semiconductor layers and source-drain metal layer 70 may be patterned by photolithography or the like so as to define TFT active area or island 74 above gate electrode 26 as shown in FIG. 6. After photoresist 72 has been applied on top of layer 70, conventional Cr etchant is used to etch Cr layer 70 and thereafter Reactive Ion Etching (RIE) is used to remove the exposed portions of semiconductor layers 28 and 30 so as to form TFT island 74. The etchant for Cr layer 70 may be, for example, a mixture of ceric ammonium nitrate and nitric acid in deionized water.

Figure 7:
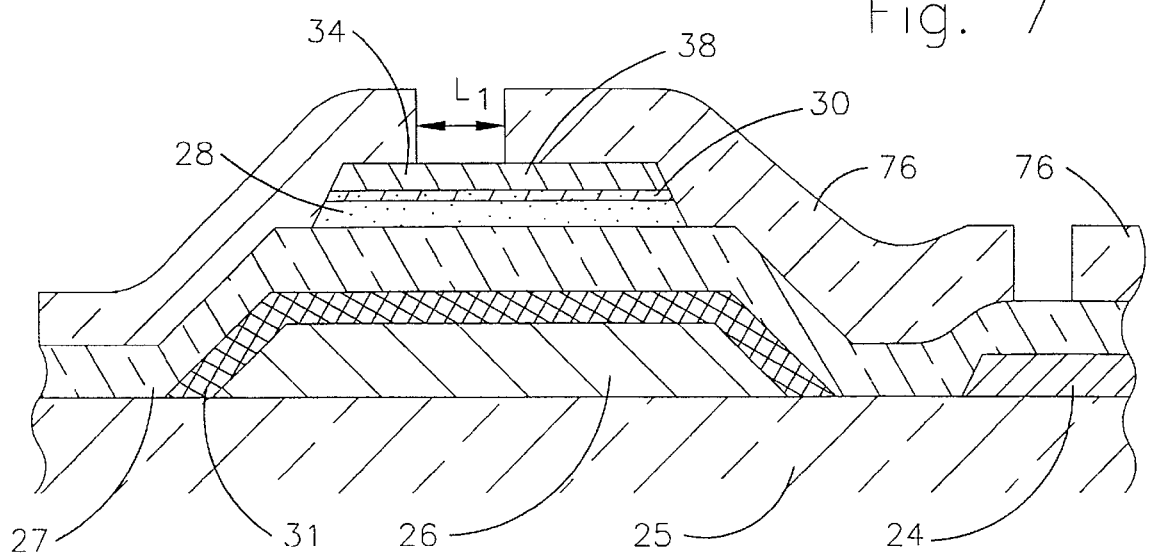
FIG. 7 is a side elevational cross sectional view of a further step in the manufacture of the TFT of FIGS. 2–6 wherein a fourth photoresist is provided on the substrate.
Figure 8:
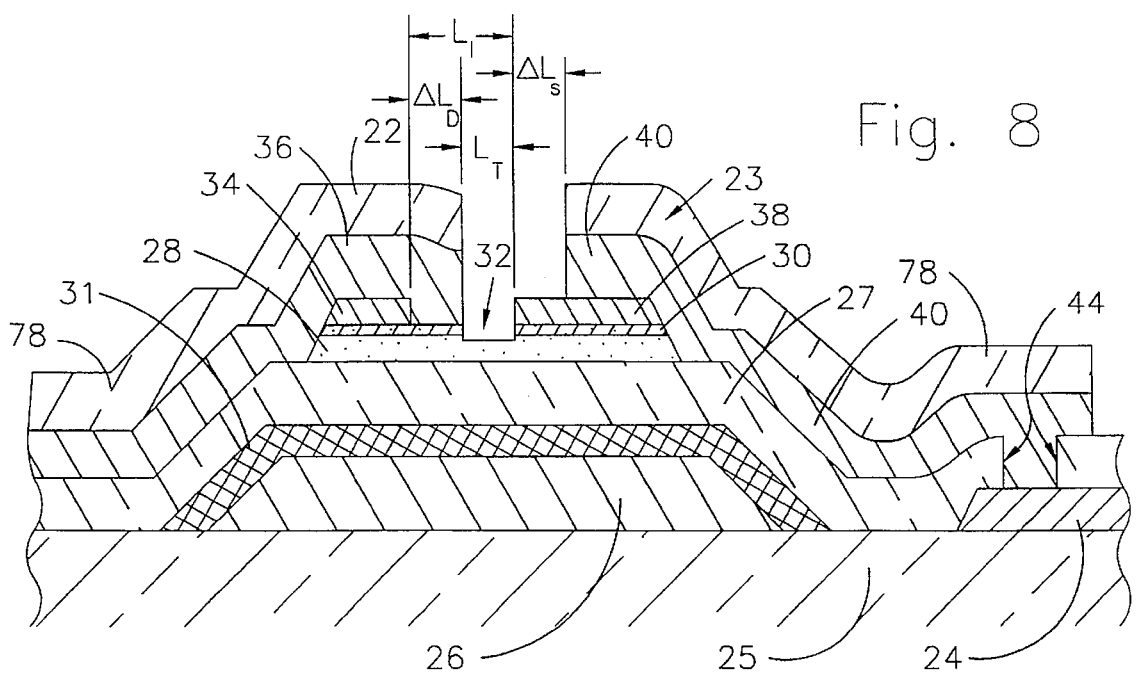
FIG. 8 is a side elevational cross sectional view of a further step in the manufacture of the TFT of FIGS. 2–7, wherein a second source-drain layer and fifth photoresist are provided, after the via and first channel are etched using the fourth photoresist.

After TFT island 74 (see FIG. 6) is formed, a fourth photoresist 76 is deposited over TFT island 74 and gate insulating layer 27 as shown in FIG. 7. Referring to FIGS. 7–8, fourth photoresist 76 is used to pattern and etch both a via 44 in layer 27 for each pixel and a channel of length $L_1$ in the TFT island area of Cr layer 70 (34, 38) for each LCD pixel. Via 44 in gate insulating layer 27 is provided by way of RIE so as to expose pixel electrode 24 so that it may be electrically contacted by source 23 as will be described hereinafter. The channel of length $L_1$ etched in the Cr layer using photoresist 76 is provided above semiconductor layers 28 and 30, with the result being drain electrode portion 34 and source electrode portion 38, both of which originated from layer 70. Channel length $L_1 = \Delta L_D + L_T$.

After the Cr or first source-drain channel of length $L_1$ and via 44 are etched or otherwise formed using photoresist 76, another source-drain metal layer (e.g. Mo) is deposited on substrate 25 to a thickness of from about 2,000–7,000 Å, preferably about 5,000 Å. This later deposited source-drain metal layer results in drain portion 36 which contacts layer 30 through the previously etched channel of length $L_1$, and source portion 40 (which overlays layer 38) after patterning and etching which will be described below. This Mo source-drain metal layer is deposited so that it contacts pixel electrode 24 through via 44 (for each pixel) as well as the top of source layer 38.

Following the placement of the Mo layer on substrate 25, fifth photoresist 78 is applied. Photoresist 78 is applied in a pattern so as to expose the Mo source-drain layer in a channel area of length $L_2$ and over a substantial portion of pixel electrode 24. Channel length $L_2 = \Delta L_S + L_T$. Thereafter, the Mo source-drain layer is etched in its exposed areas to form drain portion 36 and source portion 40 as shown in FIG. 8 and optionally the corresponding column or drain address lines 55. The Mo etchant may be a known mixture of phosphoric acid, acetic acid, nitric acid, and deionized water according to certain embodiments.

Following the deposition, patterning, and etching of the later source-drain layer using photoresist 78, n+ a-Si contact layer 30 is etched (e.g. RIE) in order to form TFT channel 32 of length $L_T$ as shown in FIGS. 8–10 so that only intrinsic a-Si layer 28 is left between the source and drain electrodes. During the n+ a-Si layer 30 etching, a small portion of layer 28 is inevitably etched in order to ensure that all n+ a-Si is removed from the TFT channel area. The result is the TFT shown in FIG. 8 absent photoresist layer 78.

Following the formation of the TFT as illustrated in FIG. 8, passivation layer 46 of silicon nitride or the like may optionally be deposited on the upper surface of the TFT as shown in FIG. 9. Passivation layer 46 (from about 2,000–4,000 Å thick, preferably about 2,000 Å) is then removed from the pixel electrode 24 areas according to certain embodiments so as to maximize the stability of the characteristics of the TFT. Passivation layer 46 is removed by RIE from the pixel electrode areas by way of sixth photoresist 80 which is applied and patterned on top of layer 46 so as to expose it over top of a substantial portion of pixel electrodes 24. The end result is TFT 21 (and an array thereof) as shown in FIG. 10(a) and 10(b). The above-described steps used in manufacturing TFT 21 may be used to make a single TFT 21 or alternatively an array of TFTs 21 as shown in FIGS. 11–12 for the purpose of placement on the active plate of a liquid crystal display.

According to certain alternative embodiments of this invention, pixel electrode 24 may be deposited and patterned on substrate 25 after the deposition of passivation layer 46 so that vias 44 are not required. In such embodiments, each pixel electrode 24 of the LCD would be connected to a Mo layer 40 by way of another via formed in layer 46. In such cases, layer 46 would not have to be removed (i.e. etched) from the viewing areas (pixel areas) of the LCD.

In sum, the channel length $L_T$ of TFT 21 can be made smaller than the feature size permitted by the lithography used given the desired yield because source 23 and drain 22 include separate layers which are patterned separately. The uniformity of channel length $L_T$ of a plurality of TFTs 21 in an array area in LCD applications depends upon the overlay accuracy of the masks and exposure equipment used. Total overlay accuracy is typically about four times better than resolution. An array of TFTs 21 with some variation in $L_T$ across the LCD viewing area has better display performance than prior art TFTs with substantially constant channel lengths.

Figure 11:
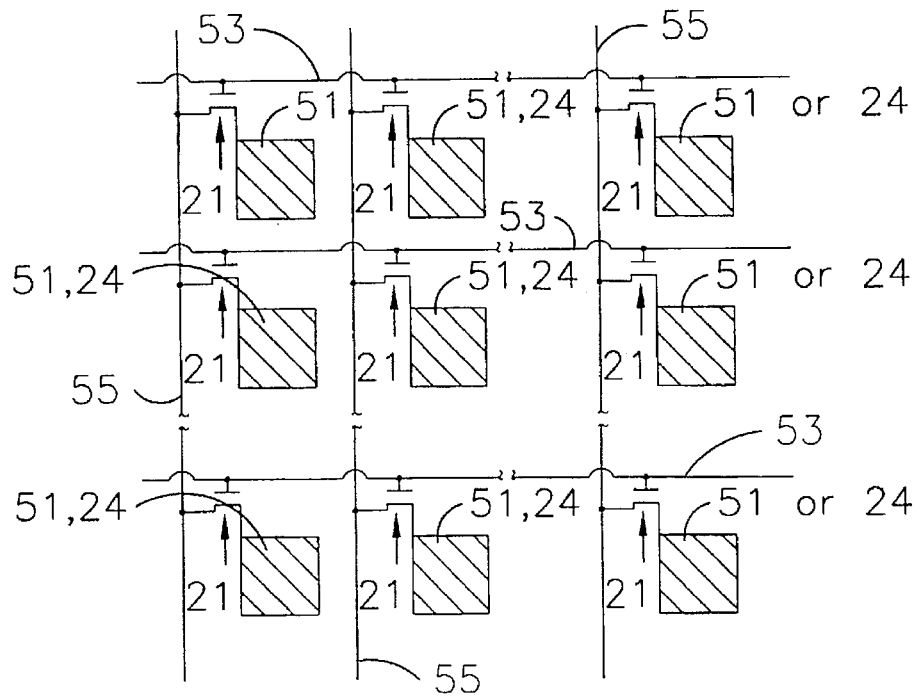
FIG. 11 is a diagram of a TFT array including a plurality of the FIG. 10 TFTs connected to respective gate and drain address lines in a liquid crystal display.
Figure 12:
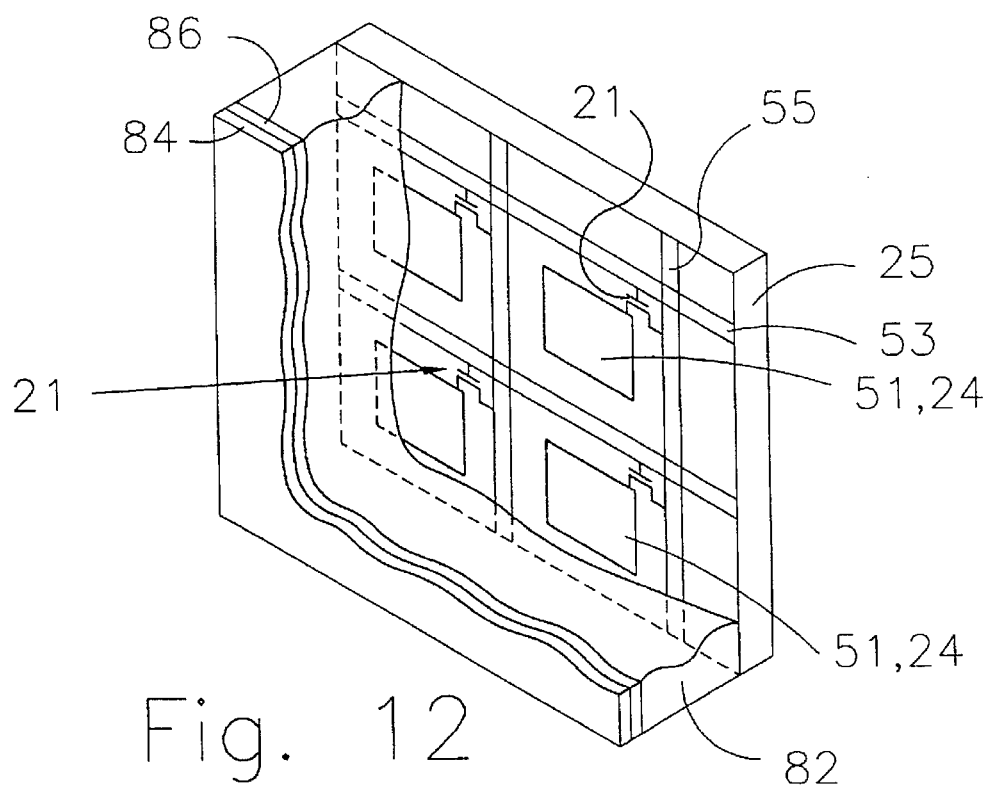
FIG. 12 is a partial cut-away perspective view of an active matrix liquid crystal display (AMLCD) including a plurality of the FIG. 10 TFTs arranged in an array as set forth in FIG. 11, the TFTs acting as switching devices for the display pixels.

FIG. 11 illustrates an array of TFTs 21 (linear or ring-shaped) which act as switching elements for LCD pixel electrodes 24, 51. Each TFT 21 is electrically connected to a row address line 53 and a column address line 55. For example, row or gate address lines 53 are connected to the TFT gate electrodes 26 while column address lines 55 are connected to drain electrodes 22.

TFTs 21 and the above-described methods of making same are fully compatible with both linear TFT designs and ring-shaped TFT designs. For example, the above-described method and TFT 21 may be used in conjunction with the ring-shaped TFTs of U.S. Pat. No. 5,414,283, the disclosure of which is hereby incorporated herein by reference. See also application Ser. No. 08/444,673 for ring-shaped source-drain designs. In addition to being compatible with ring-shaped and linear channels, TFTs according to different alternative embodiments of this invention may be provided with either U-shaped or L-shaped transistor channels. The advantage associated with ring-shaped, L-shaped, and U-shaped TFTs is that they are less affected by misalignment of the source and drain (i.e. pattern registration error). For example, in an annular-shaped TFT, when misaligned, the increase in channel length on the left side of the channel is approximately offset by reduced channel length on the right. Thus, the TFT ON current is not significantly affected.

In certain ring-shaped embodiments, the central source is Cr and the surrounding drain is Mo, with the two being deposited at different steps. The ITO pixel electrode is laid over the source and drain, so as to contact the central source.

FIG. 12 is a perspective partial cut-away view of an AMLCD including an array of TFTs 21 which act as switching elements for pixel electrodes 24, 51. This AMLCD includes liquid crystal layer 82 sandwiched and sealed between active substrate 25 and substrate 84. Common electrode 86 is positioned adjacent liquid crystal layer 82 and is located between liquid crystal layer 82 and substrate 84.

The often-described figure of merit for a TFT is $I_{ON}/C_{gs(ON)}$. The reduced channel length $L_T$ of TFTs 21 according to different embodiments of this invention reduces pixel flickering, image retention, and gray level non-uniformity by increasing $I_{ON}/C_{gs(ON)}$. In other words, this figure of merit is the TFT ON current divided by the TFT gate-source capacitance in the ON state. It is desirable to increase this figure of merit to as high a level as possible. The ON current ($I_{ON}$) is the ever important parameter used in determining how fast a pixel will charge up. $C_{gs(ON)}$ is the gate-source capacitance in the TFT ON state and determines the pixel voltage drop or shift after switching off the gate.

The reduced channel lengths $L_T$ of TFTs 21 (and the corresponding reduced channel widths) improve LCD viewing characteristics relative to the prior art. For example, in commonly owned application Ser. No. 08/444,673, an array of linear TFTs with reduced channel lengths was compared to a pair of art TFT arrays. See also commonly owned application Ser. No. 08/460,248. All three arrays had TFTs with channel widths of about 24 µm. The two prior art TFT arrays had channel lengths of about 6 µm and the TFT array with reduced channel lengths had channel lengths of about 3 µm. The figure of merit $I_{ON}/C_{gs(ON)}$ in one example was 0.374 for a TFT in the reduced channel length TFT array while corresponding TFTs in the two prior art arrays had $I_{ON}/C_{gs(ON)}$ values of 0.217 µA per fF and 0.143 µA per fF respectively. Thus, it is clear that by reducing channel length, $I_{ON}/C_{gs(ON)}$ for the TFT improves thereby reducing pixel flickering, image retention, and gray scale non-uniformity.

Once given the above disclosure, therefore, various other modifications, features, or improvements will become apparent to the skilled artisan. Such other features, modifications, and improvements will thus be considered a part of this invention, the scope of which is to be determined by the following claims:

We claim:

1. A method of making a thin film transistor comprising the steps of:

depositing a gate layer on a substrate;

applying a first photoresist layer over the gate layer and thereafter etching the gate layer using the first photoresist so as to form a gate electrode;

depositing a substantially transparent conductive layer on the substrate;

applying a second photoresist layer over the substantially transparent layer and thereafter etching the substantially transparent layer using the second photoresist so as to form a pixel electrode;

depositing a gate insulating layer, a semiconductor layer, a doped semiconductor contact layer, and a first source-drain conductive layer on the substrate;

applying a third photoresist layer over the gate insulating layer, semiconductor layer, doped semiconductor contact layer, and first source-drain layer;

etching the first source-drain layer, the doped semiconductor contact layer, and the semiconductor layer using the third photoresist layer so as to form a thin film transistor area or island;

applying a fourth photoresist layer over the gate insulating layer and the transistor island;

etching a via into the gate insulating layer using the fourth photoresist layer so that the pixel electrode is exposed through the via;

etching a channel of length $L_1$ in the first source-drain on the island using the fourth photoresist;

depositing a second source-drain conductive layer on the substrate over the etched channel in the first source-drain layer and the via so that the second source-drain layer conductively contacts the pixel electrode through the via; and applying a fifth photoresist layer over the second source-drain layer and etching a channel of length $L_2$ in the second source-drain layer using the fifth photoresist layer so as to form a thin film transistor.

2. The method of claim 1, further comprising the step of etching the channel in the second source-drain layer so that the resulting thin film transistor channel of length $L_T$ is defined on one side by a portion of the first source-drain layer and on the other side by a portion of the second source-drain layer whereby the transistor has a channel length $L_T$ less than the length $L_2$ of the channel etched in the second source-drain layer.

3. The method of claim 2, further comprising the steps of:

depositing a passivation layer over the thin film transistor;

applying a sixth photoresist layer over the passivation layer; and etching the passivation layer using the sixth photoresist so as to remove it from an area over the pixel electrode.

4. The method of claim 1, wherein the recited steps are performed in the order in which they are recited.

5. The method of claim 1, further comprising the steps of etching the channels in the first and second source-drain layers respectively so that the resulting transistor channel length "$L_T$" is defined by the equation:

$$L_T = L_1 - \Delta L$$

where $L_1$ is the length of the channel in the first source-drain conductive layer and $\Delta L$ is the offset length between the first and second source-drain layers on one of the source and drain electrodes.

6. A method of making a liquid crystal display including a plurality of thin film transistors, the method comprising the steps of:

providing a plurality of gate electrodes on a first substrate;

depositing a substantially transparent layer on said first substrate;

patterning said substantially transparent layer so as to form a plurality of pixel electrodes for applying a voltage to a liquid crystal layer;

providing a gate insulating layer on said first substrate over said gate electrodes;

depositing and patterning a semiconductor layer on said first substrate over said gate insulating layer so as to form a plurality of transistor islands or areas;

depositing a first conductive layer over said semiconductor layer and patterning said first conductive layer so that the patterned first conductive and semiconductor layers form said transistor islands;

applying a photoresist layer over said islands and said gate insulating layer;

etching (i) vias in said gate insulating layer using said photoresist so as to expose said pixel electrodes and (ii) channels in said first conductive layers on the islands using said photoresist;

providing a second conductive layer on said first substrate over said etched first conductive layer so that said second conductive layer contacts said pixel electrodes through said vias and also contacts said first conductive layer on said islands;

patterning said second conductive layer so as to form transistor channels having a length $L_T$; and providing the liquid crystal layer between said first substrate and a second substrate thereby forming a liquid crystal display.

7. The method of claim 6, further including the steps of etching a channel in said second conductive layer so that said channel in said first conductive layer has a length $L_1$ and said channel in said second conductive layer has a length $L_2$ and wherein $L_T$ is less than both $L_1$ and $L_2$.

8. The method of claim 7, wherein source and drain electrodes of said thin film transistor each include said first and second etched conductive layers offset from one another laterally so that said source electrode includes a portion of said first conductive layer and a portion of said second conductive layer offset from one another, and said drain electrode also includes a portion of said first conductive layer and a portion of said second conductive layer offset laterally from one another.

9. The method of claim 7, further including the steps of forming said transistor channel over said semiconductor layer so that said transistor channel length $L_T$ is defined by the following equation:

$$L_T = L_{1,2} - \Delta L$$

where $L_{1,2}$ is one of said channel length $L_1$ and said channel length $L_2$, and $\Delta L$ is the offset distance between said first and second etched conductive layers on one of said source and said drain electrodes.

10. The method of claim 7, further comprising the steps of:

forming one of a source and drain electrode of said thin film transistor so as to include a portion of said etched first conductive layer contacting but laterally offset by a distance $\Delta L$ from a portion of said second conductive layer; and locating said first and second conductive portions so that said channel length $L_T$ of said thin film transistor is defined by the equation:

$$L_T = L_{1,2} - \Delta L$$

where $\Delta L$ is said offset distance and $L_{1,2}$ is one of (i) the length of said channel $L_1$ and (ii) the length of said channel $L_2$.

11. The method of claim 6, further comprising the steps of depositing a doped semiconductor contact layer over said semiconductor layer and patterning said doped semiconductor layer to form said transistor area.

12. The method of claim 1, further comprising the steps of patterning and etching the channel of length $L_1$ in the first source-drain layer so that the transistor channel of length $L_T$ is defined by the equation:

$$L_T = L_1 - \Delta L_D$$

wherein $\Delta L_D$ is the lateral offset on the drain between the first and second source-drain layers.

* * * * *